(12) United States Patent
Kim et al.

(10) Patent No.: US 11,349,097 B2
(45) Date of Patent: *May 31, 2022

(54) DISPLAY DEVICE INCLUDING A BARRIER LAYER WITH A CONCAVO-CONVEX SIDE SURFACE

(71) Applicant: SAMSUNG DISPLAY CO., LTD., Yongin-si (KR)

(72) Inventors: Joonghyun Kim, Yongin-si (KR); Kyongtaeg Lee, Yongin-si (KR); Sangyoung Park, Yongin-si (KR); Kyungsuk Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 122 days.

This patent is subject to a terminal disclaimer.

(21) Appl. No.: 16/840,695

(22) Filed: Apr. 6, 2020

(65) Prior Publication Data
US 2020/0235338 A1 Jul. 23, 2020

Related U.S. Application Data

(63) Continuation of application No. 16/157,749, filed on Oct. 11, 2018, now Pat. No. 10,629,845.

(30) Foreign Application Priority Data

Mar. 16, 2018 (KR) .................... 10-2018-0031103

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3276* (2013.01)

(58) Field of Classification Search
CPC ............ H01L 51/5253; H01L 27/3246; H01L 27/3276
See application file for complete search history.

(56) References Cited

U.S. PATENT DOCUMENTS 10,439,017 B2 * 10/2019 Kim .................... H01L 27/1218
10,629,845 B2 * 4/2020 Kim .................... H01L 51/5246
(Continued)

FOREIGN PATENT DOCUMENTS

| JP | 2007-194062 | 8/2007 |
| KR | 1020120072173 | 7/2012 |

(Continued)

*Primary Examiner* — Lex H Malsawma
(74) *Attorney, Agent, or Firm* — F. Chau & Associates, LLC

(57) ABSTRACT

A display device includes a substrate including a display area and a peripheral area. A display element is disposed in the display area and is electrically connected to a thin film transistor. A power supply line is disposed in the peripheral area. An insulating layer covers a portion of the power supply line. A barrier layer is disposed on the insulating layer and includes a first side surface facing the display area and a second side surface facing away from the display area. At least one of the first side surface or the second side surface includes a concavo-convex surface. The barrier layer forms a step difference with respect to an upper surface of the insulating layer. An end of the insulating layer is positioned beyond the second side surface of the barrier layer on a side of the barrier layer facing away from the display area.

10 Claims, 10 Drawing Sheets

(56) References Cited

U.S. PATENT DOCUMENTS

| | | | |
|---|---|---|---|
| 2015/0228927 A1* | 8/2015 | Kim | H01L 27/3276 257/40 |
| 2016/0204373 A1* | 7/2016 | Park | H01L 27/3246 257/40 |
| 2018/0033998 A1* | 2/2018 | Kim | H01L 27/3246 |
| 2018/0097200 A1 | 4/2018 | Park et al. | |
| 2018/0151838 A1 | 5/2018 | Park et al. | |
| 2018/0205037 A1 | 7/2018 | Kim et al. | |
| 2019/0006442 A1 | 1/2019 | Byun et al. | |
| 2019/0288234 A1 | 9/2019 | Kim et al. | |

FOREIGN PATENT DOCUMENTS

| | | |
|---|---|---|
| KR | 1020150025994 | 3/2015 |
| KR | 1020160087982 | 7/2016 |
| KR | 1020170090382 | 8/2017 |

\* cited by examiner

DISPLAY DEVICE INCLUDING A BARRIER LAYER WITH A CONCAVO-CONVEX SIDE SURFACE

CROSS-REFERENCE TO RELATED APPLICATIONS

This application is a continuation of U.S. patent application Ser. No. 16/157,749 filed on Oct. 11, 2018, which claims priority under 35 U.S.C. § 119 to Korean Patent Application No, 10-2018-0031103, filed on Mar. 16, 2018, in the Korean Intellectual Property Office, the disclosures of which are incorporated by reference herein in their entireties.

1. TECHNICAL FIELD

Exemplary embodiments of the present invention relate to a display device, and more particularly, to a display device including a barrier layer.

2. DISCUSSION OF RELATED ART

Display devices may visually display images generated by electrical signals. Such display devices may be employed in various devices, such as for displaying an image. Display devices may have a relatively small non-display area and may display a relatively high definition image. Efforts have been made to reduce an area of the non-display area, and thus efforts have been made to reduce an area occupied by an organic layer in the non-display area.

SUMMARY

According to an exemplary embodiment of the present invention, a display device may be sealed by a sealing member including an inorganic layer or an organic layer.

According to an exemplary embodiment of the present invention, a display device includes a substrate including a display area and a peripheral area adjacent to the display area. A display element is disposed in the display area and is electrically connected to a thin film transistor. A power supply line is disposed in the peripheral area. An insulating layer covers a portion of the power supply line. A barrier layer is disposed on the insulating layer and includes a first side surface facing the display area and a second side surface facing away from the display area. At least one of the first side surface or the second side surface includes a concavo-convex surface. The barrier layer forms a step difference with respect to an upper surface of the insulating layer facing away from the substrate. An end of the insulating layer is positioned beyond the second side surface of the barrier layer on a side of the barrier layer facing away from the display area.

The display device may include a planarization layer between the thin film transistor and the display element. A pixel-defining layer may be disposed on a pixel electrode of the display element. The pixel-defining layer may define an opening exposing the pixel electrode.

The insulating layer may include a same material as the planarization layer. The barrier layer may include a same material as the pixel-defining layer.

The barrier layer may be spaced apart from the pixel-defining layer by a predetermined distance.

The power supply line may include a body portion extending along an edge of the display area and a connection portion extending from the body portion toward the edge of the substrate so as to cross the body portion. The barrier layer may overlap the body portion of the power supply line along a direction orthogonal to an upper surface of the substrate.

The connection portion may include a concave-convex surface.

The display device may include a terminal disposed in the peripheral area adjacent to a first side of the display area. The power supply line may be disposed between the first side of the display area and the terminal.

The barrier layer may extend to surround the display area in a plan view.

The display device may include a dam surrounding the display area in a plan view.

The barrier layer may be between an edge of the display area facing the peripheral area and the dam.

According to an exemplary embodiment of the present invention, a display device includes a substrate including a display area and a peripheral area adjacent to the display area. A thin film transistor is disposed in the display area. A pixel electrode is electrically connected to the thin film transistor. An insulating layer is between the thin film transistor and the pixel electrode. A power supply line is disposed in the peripheral area. A portion of the power supply line is covered by the insulating layer. A barrier layer is disposed in the peripheral area to overlap the power supply line along a direction orthogonal to an upper surface of the substrate. The barrier layer includes a first side surface facing the display area and a second side surface facing away from the display area. At least one of the first side surface or the second side surface includes a concavo-convex surface. The barrier layer forms a step difference with respect to an upper surface of the insulating layer facing away from the upper surface of the substrate.

The display device may include a pixel-defining layer defining an opening exposing the pixel electrode. An emission layer may overlap the pixel electrode through the opening of the pixel-defining layer. An opposite electrode may be on the emission layer.

The barrier layer may be spaced apart from the pixel-defining layer by a predetermined distance.

An end of the insulating layer may be positioned beyond the second side surface of the barrier layer on a side of the barrier layer facing away from the display area.

The power supply line may include a main power supply line portion extending along a first side of the display area. The barrier layer may overlap the main power supply line portion.

The display device may include a terminal disposed in the peripheral area adjacent to the first side of the display area. The power supply line may include a connection portion extending in a direction crossing the main power supply line portion and connecting the main power supply line portion with the terminal.

An edge of the connection portion may include a concavo-convex surface.

The display device may include a plurality of driving voltage lines extending onto the display area and electrically connected to the thin film transistor. The power supply line may supply a first power supply to the plurality of driving voltage lines.

The display device may include a thin film encapsulation layer covering the display area and including at least one organic encapsulation layer and at least one inorganic encapsulation layer. The at least one organic encapsulation layer may extend to the peripheral area so as to cover the barrier layer.

According to an exemplary embodiment of the present invention, a display device includes a substrate, and a display area and a peripheral area adjacent to the display area defined above the substrate. A power supply line is positioned above the substrate. An insulating layer is disposed on the power supply line. A first inorganic encapsulation layer is disposed on the insulating layer. An organic encapsulation layer is disposed on the first inorganic encapsulation layer. A second inorganic encapsulation layer is disposed on the organic encapsulation layer. A barrier layer is disposed on the insulating layer in the peripheral area. A dam is disposed on the insulating layer in the peripheral area. The dam is positioned further away from the display area than the barrier layer.

An uppermost level of the dam facing away from the substrate may be further away from the substrate than an uppermost level of the barrier layer facing away from the substrate.

A trench may be formed in the insulating layer having a predetermined width between the barrier layer and the dam.

The barrier layer may include a material different from a material included in the insulating layer.

The dam may include a material different from material included in the insulating layer.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
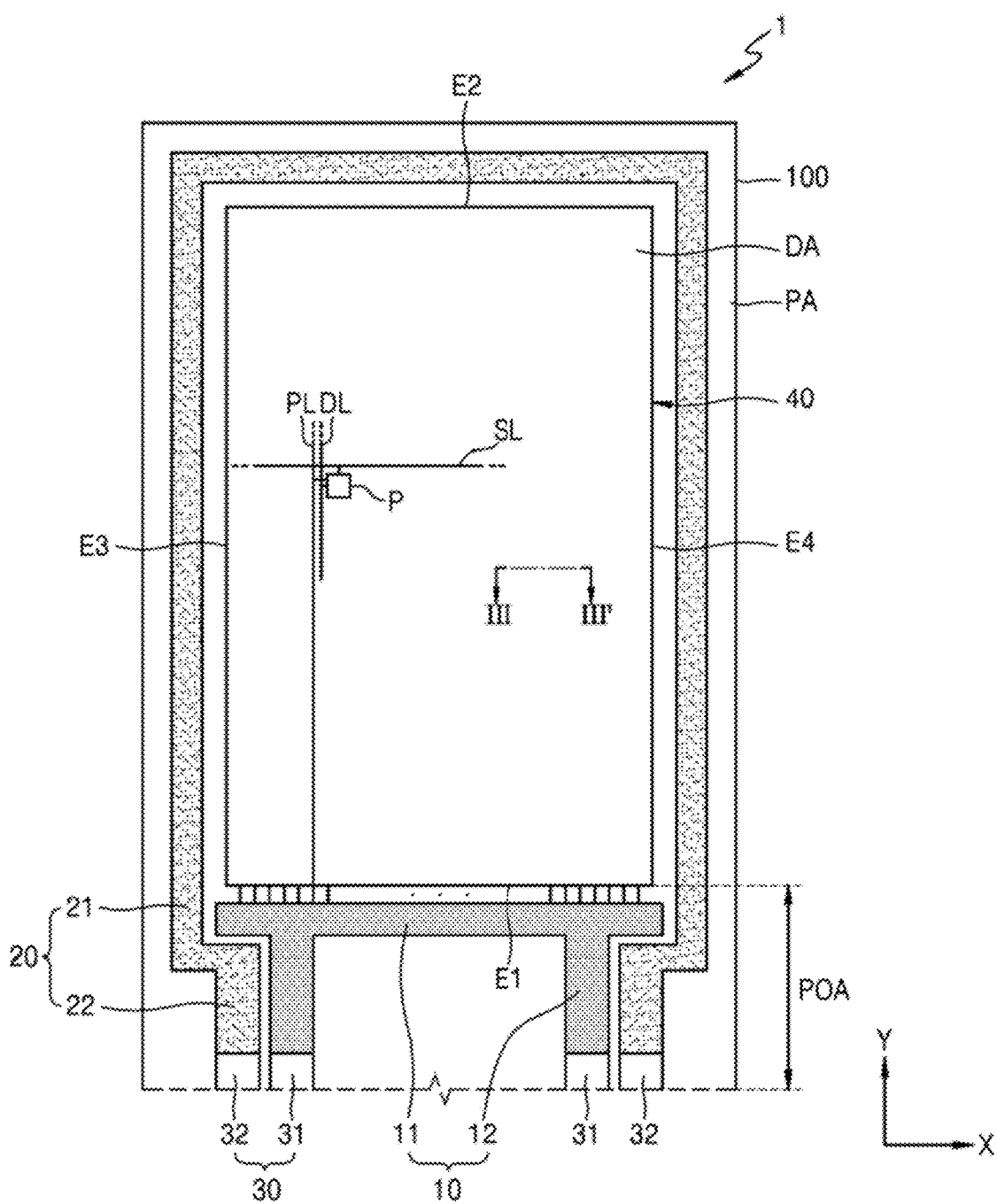
FIG. 1 is a plan view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

As used herein, the singular forms "a," "an," and "the" may include the plural forms as well, unless the context clearly indicates otherwise.

It will be understood that when, a component, such as a layer, a film, a region, or a plate, is referred to as being "on" another component, the component may be directly on the other component or intervening components may be present.

Sizes of elements in the drawings may be exaggerated for clarity of description.

When a certain embodiment may be implemented differently, a specific process order may be performed differently from the described order. For example, two consecutively described processes may be performed substantially at the same time or performed in an order opposite to the described order.

It will be understood that when an element, an area, or a layer is referred to as being connected to another element, area, or layer, it may be directly or indirectly connected to the other element, area, or layer. For example, intervening elements, areas, or layers may be present. For example, it will be understood in this specification that when an element, an area, or a layer is referred to as being in contact with or being electrically connected to another element, area, or layer, it may be directly or indirectly in contact with or electrically connected to the other element, area, or layer. For example, intervening elements, areas, or layers may be present.

A display device according to an exemplary embodiment of the present invention may be a device configured to display an image. The display device may include, for example, a liquid crystal display (LCD) device, an electrophoretic display device, an organic light-emitting display device, an inorganic light-emitting display device, a field-emission display device, a surface-conduction electron-emitter display device, a plasma display device, or a cathode ray display device.

An organic light-emitting display device will be described below. However, display devices according to an exemplary embodiment of the present invention are not limited thereto, and may include various types of display devices.

FIG. 1 is a plan view of a display device according to an exemplary embodiment of the present invention.

Referring to FIG. 1, a display device 1 may include a display 40 disposed on a substrate 100. The display 40 may include pixels P connected to scan lines SL extending in an x-direction and data lines DL extending in a y-direction crossing the scan lines SL. As an example, the x-direction may be perpendicular to the y-direction. The display 40 may display an image via light emitted from the pixels P and may define a display area DA. Each pixel P may emit, for example, red, green, or blue light. Alternatively, each pixel P may emit red, green, blue, or white light. Each pixel P may include a display element, such as an organic light-emitting diode OLED. Thus, the pixel P may be interchangeably referred to as a display element herein.

As an example, a plurality of pixels P may be arranged on the substrate 100. The pixels P may be spaced apart from each other. For example, the pixels P may be arranged in a plurality of rows and columns (e.g., in a plan view) to have a matrix configuration.

A peripheral area PA may be outside the display area DA (e.g., may be adjacent to the display area. DA). The peripheral area PA may surround the display area DA (e.g., in a plan view). The peripheral area PA may be an area in which the pixels P are not disposed and may correspond to a non-display area not displaying an image. A scan driver may provide a scan signal to the scan lines SL and a data driver may provide a data signal to the data lines DL. The scan driver and the data driver may be disposed in the peripheral area PA. As an example, the peripheral area PA may be arranged at four sides of the display region DA in a plan view; however, exemplary embodiments of the present invention are not limited thereto. For example, the peripheral area PA may be arranged at less than four sides (e.g., three sides) of the display region DA in a plan view.

A first power supply line 10 and a second power supply line 20 may be disposed in the peripheral area PA. The first power supply line 10 may be adjacent to a first side E1 of the display area DA and the second power supply line 20 may be adjacent to second through fourth sides E2, E3, and E4 of the display area DA. For example, the first power supply line 10 may be disposed between the first side E1 of the display area DA and a pad portion 30, and the second power supply line 20 may have a loop shape with one open side corresponding to the first side E1, and may partially surround the display area DA (e.g., in a plan view).

The first power supply line 10 may include a first body portion 11 extending along the first side E1 of the display area DA. The first body portion 11 may extend in the x direction along, the first side E1 of the display area DA and may have a length that is substantially equal to or greater than a length of the first side E1 of the display area DA.

The first body portion 11 may be integrally formed with a first connection portion 12 extending in the y direction from the first body portion 11. The first connection portion 12 may extend in the y direction toward the pad portion 30 in a pull-off area (e.g., a leading-in area) POA. The leading-in area POA may be, for example, an area ranging from the first side E1 of the display area DA adjacent to the pad portion 30 to a side of the substrate 100 (e.g., to an outermost edge of the substrate 100 facing away from the display area DA). The leading-in area POA may be an area from the first side E1 of the display area DA to the pad portion 30. The first connection portion 12 may extend from the first body portion 11 toward an edge of the substrate 100 (e.g., to an outermost edge of the substrate 100 facing away from the display area DA) and may be connected to a first terminal 31 of the pad portion 30.

As an example, a first direction X may be perpendicular to a second direction Y. The first direction X and the second direction Y may define a plan along which the substrate 100 extends. A third direction Z may be perpendicular to the first and second direction X and Y. Thus, the third direction Z may be orthogonal to a plane extending in the first and second direction X and Y.

The second power supply line 20 may include a second body portion 21 extending along the second through fourth sides E2, E3, and E4 of the display area DA. The second body portion 21 may partially surround the display area DA along the second through fourth sides E2, E3, and E4 of the display area DA except for the first side E1 of the display area DA (e.g., in a plan view). The second side E2 may be located at a side opposite to the first side E1, and the third and fourth sides E3 and E4 may connect the first side E1 with the second side E2 and may be located at sides opposite to each other. The second body portion 21 may partially surround the display area DA and opposite ends of the first body portion 11 (e.g., in a plan view).

The second body portion 21 may be integrally formed with a second connection portion 22 extending in the y direction from the second body portion 21. The second connection portion 22 may extend in the y direction toward the pad portion 30 in the leading-in area POA. The second connection portion 22 may extend in the leading-in area POA in parallel to the first connection portion 12 and may be connected to a second terminal 32 of the pad portion 30.

The pad portion 30 may be in a position corresponding to an end of the substrate 100 (e.g., to an outermost end of the substrate 100 facing away from the display area DA). The pad portion 30 need not be covered by an insulating layer, and may be exposed so as to be connected with a controller through a flexible printed circuit board. Signals or power supply from the controller may be provided to display elements via the pad portion 30.

The first power supply line 10 may provide a first power voltage ELVDD (see, e.g., FIG. 2) to each pixel P, and the second power supply line 20 may provide a second power voltage ELVSS (see, e.g., FIG. 2) to each pixel P. The first power voltage ELVDD may be provided to each pixel P via a driving voltage line PL connected to the first power supply line 10. The second power voltage ELVSS may be provided to an opposite electrode (e.g., a cathode) of the organic light-emitting diode OLED. The second body portion 21 of the second power supply line 20 and the opposite electrode of the organic light-emitting diode OLED may be connected to each other in the peripheral area PA so that the second power voltage ELVSS is transmitted to the opposite electrode of the organic light-emitting diode OLED. One driving voltage line PL may be provided. However, exemplary embodiments of the present invention are not limited thereto, and a plurality of driving voltage lines PL may be disposed in the display area DA.

Figure 2:
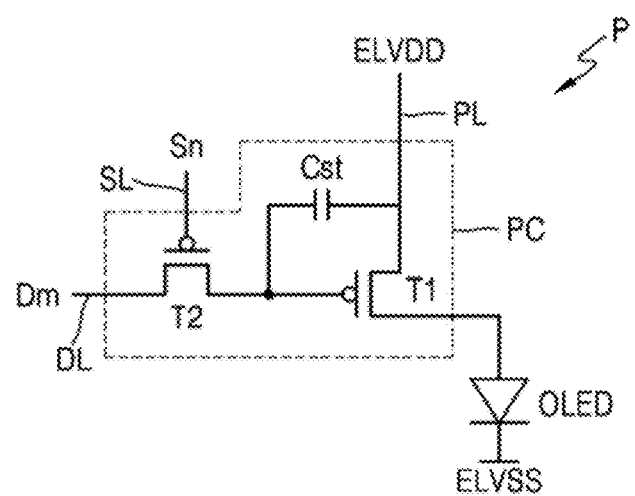
FIG. 2 is an equivalent circuit of a pixel of a display device according to an exemplary embodiment of the present invention.

FIG. 2 is an equivalent circuit of a pixel of a display device according to an exemplary embodiment of the present invention.

Referring to FIG. 2, the pixel P may include a pixel circuit PC connected to, the scan lines SL, the data lines DL, and the driving voltage line PL, and the organic light-emitting diode OLED connected to the pixel circuit PC.

A plurality of pixels P may be arranged in the display area DA on the substrate 100. As an example, the pixels P may be spaced apart from each other. For example, the pixels P may be arranged in a plurality of rows and columns (e.g., in a plan view) to have a matrix configuration.

The pixel circuit PC may include a driving thin film transistor T1, a switching thin film transistor T2, and a storage capacitor Cst. The switching thin film transistor T2 may be connected to the scan lines SL and the data lines DL and may transmit a data signal Dm provided via the data lines DL to the driving thin film transistor T1 based on a scan signal Sn provided via the scan lines SL.

The storage capacitor Cst may be connected to the switching thin film transistor T2 and the driving voltage line PL, and may store a voltage corresponding to a difference between a voltage received from the switching thin film transistor T2 and the first power voltage ELVDD (or a driving voltage) supplied via the driving voltage line PL.

The driving thin film transistor T1 may be connected to the driving voltage line PL and the storage capacitor Cst, and may control a driving current flowing through the organic light-emitting diode OLED from the driving voltage line PL based on the voltage stored in the storage capacitor Cst. The organic light-emitting diode OLED may emit light having a certain brightness based on the driving current.

As an example, the pixel circuit PC may include two thin film transistors and one storage capacitor. However, exemplary embodiments of the present invention are not limited thereto. According to an exemplary embodiment of the present invention, the pixel circuit PC may include three or more thin film transistors and/or two or more storage capacitors. Thus, the number of thin film transistors and the number of storage capacitors may be variously modified (e.g., according to a design of the pixel circuit PC).

Figure 3:
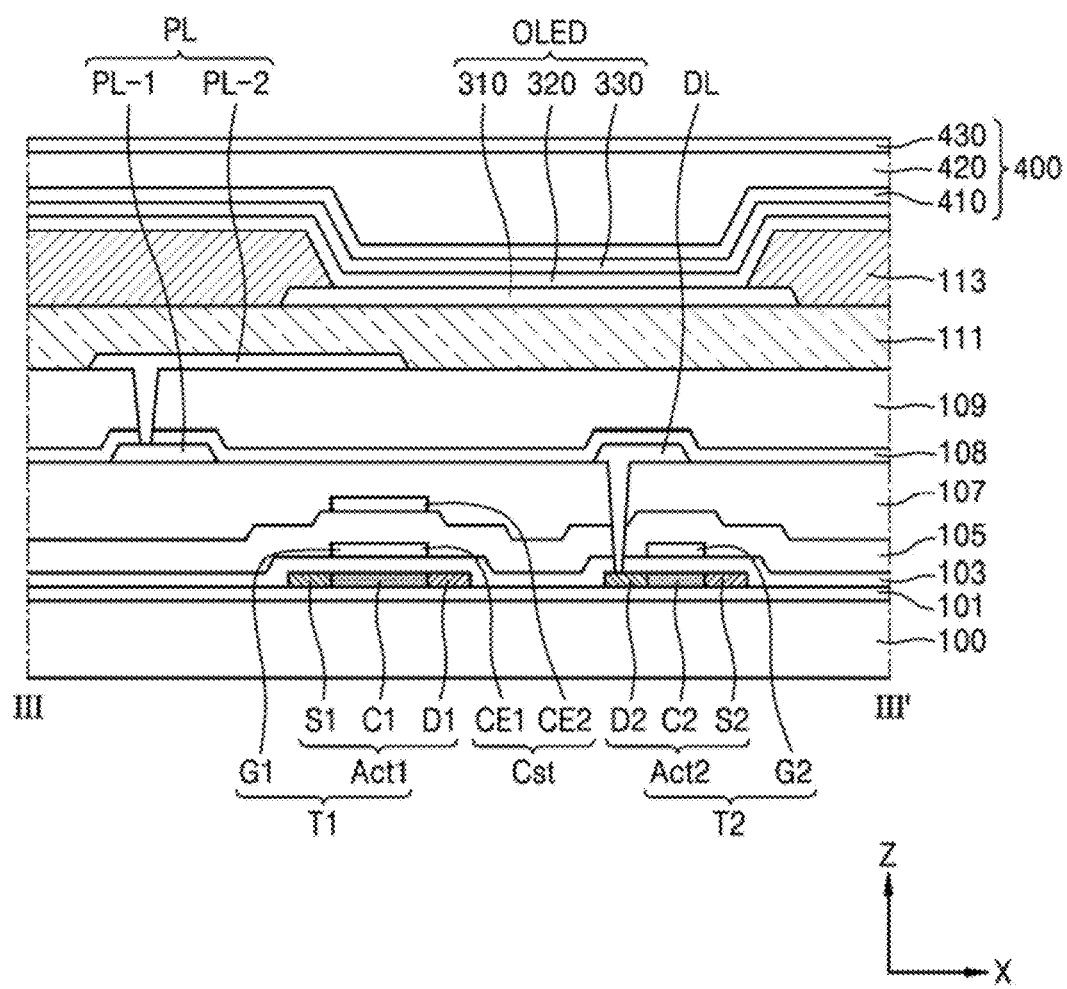
FIG. 3 is a cross-sectional view taken along a line III-III' FIG. 1 according to an exemplary embodiment of the present invention.

FIG. 3 is a cross-sectional view taken along a line III-III' of FIG. 1 according to an exemplary embodiment of the present invention.

Referring to FIG. 3, the substrate 100 may include a glass material or a polymer resin. The polymer resin may include, for example, polyethersulphone (PES), polyacrylate (PAR), polyetherimide (PEI), polyethylene naphthalate (PEN), polyethylene terephthalate (PET), polyphenylene sulfide (PPS), polyaryllate, polyimide (PI), polycarbonate (PC), or cellulose acetate propionate (CAP). The substrate 100 may have a single layer or multiple layer structure including the materials described above. When the substrate 100 includes multiple layers, the substrate 100 may further include a layer including an inorganic insulating material. The substrate 100 may have a flexible, rollable, or bendable characteristic. For example, the display device may be a bendable or foldable display device that is in a curved or bent state at some times and is in a substantially flat state at other times. Alternatively, the display device may be in a permanently folded, curved or bent state.

A buffer layer 101 may be disposed on the substrate 100 and may prevent impurities from penetrating into the substrate 100. The buffer layer 101 may include silicon oxide (SiOx) and/or silicon nitride (SiNx).

The driving thin film transistor T1 may include a driving semiconductor layer Act1 and a driving gate electrode G1, and the switching thin film transistor T2 may include a switching semiconductor layer Act2 and a switching gate electrode G2. A first gate insulating layer 103 may be disposed between the driving semiconductor layer Act1 and the driving gate electrode G1 and between the switching semiconductor layer Act2 and the switching gate electrode G2. The first gate insulating layer 103 may include an inorganic insulating material, such as SiOx, SiNx, or silicon oxynitride (SiON). The first gate insulating layer 103 may include a single layer or multiple layers. As an example, the first gate insulating layer 103 may be in direct contact with an upper surface of the driving semiconductor layer Act1 facing away from the substrate 100 and may be in direct contact with a bottom surface of the driving gate electrode G1 facing the substrate 100. Further, the first gate insulating layer 103 may be in direct contact with an upper surface of the switching semiconductor layer Act2 facing away from the substrate 100 and may be in direct contact with a bottom surface of the switching gate electrode G2 facing the substrate 100.

The driving semiconductor layer Act1 and the switching semiconductor layer Act2 may each include polysilicon. The driving semiconductor layer Act1 may include a driving channel area C1 overlapping the driving gate electrode G1 (e.g., along the Z direction) and not doped with impurities, and a driving source area S1 and a driving drain area D1 respectively at opposite sides of the driving channel area C1, which are doped with impurities. The switching semiconductor layer Act2 may include a switching channel area C2 overlapping the switching gate electrode G2 (e.g., along the Z direction) and not doped with impurities, and a switching source area S2 and a switching drain area D2 respectively at opposite sides of the switching channel area C2, which are doped with impurities. Exemplary embodiments of the present invention are not limited to the case in which the driving semiconductor layer Act1 and the switching semiconductor layer Act2 include polysilicon. According to an exemplary embodiment of the present invention, the driving semiconductor layer Act1 and the switching semiconductor layer Act2 may include an oxide semiconductor, or an organic semiconductor.

The driving and switching gate electrodes G1 and G2 may be disposed on the first gate insulating layer 103 to overlap the driving and switching channel areas C1 and C2 (e.g., along the Z direction). The driving and switching gate electrodes G1 and G2 may each include Mo, Al, Cu, or Ti, and may each include a single layer or multiple layers. For example, the driving and switching gate electrodes G1 and G2 may each include a single layer including Mo.

As an example, the source area and the drain area of the thin film transistors described herein may be a source electrode and a drain electrode of the thin film transistor, respectively. For example, the driving source area S1 and the driving drain area D1 may be a driving source electrode and a driving drain electrode, respectively, and the switching source area S2 and the switching drain area D2 may be a switching source electrode and a switching drain electrode, respectively. The phrases "the source area" and "the drain area" may be used herein rather than the phrases "the source electrode" and "the drain electrode," respectively.

According to an exemplary embodiment of the present invention, the storage capacitor Cst may be disposed to overlap the driving thin film transistor T1 (e.g., along the Z direction). Thus, areas of the storage capacitor Cst and the driving thin film transistor T1 may be increased, and a relatively high quality image may be displayed. For example, the driving gate electrode G1 may be a first storage capacitor plate CE1 of the storage capacitor Cst and a second storage capacitor plate CE2 may overlap the first storage capacitor plate CE1 (e.g., along the Z direction) with a second gate insulating layer 105 between the first storage capacitor plate CE1 and the second storage capacitor plate CE2. The second gate insulating layer 105 may include SiOx, SiNx, or SiON, and may include a single layer or multiple layers (e.g., including the materials described above).

The driving and switching thin film transistors T1 and T2, and the storage capacitor Cst may be substantially covered by an interlayer insulating layer 107. The interlayer insulating layer 107 may include an inorganic material, such as SiON, SiOx, and/or SiNx. The data lines DL may be disposed on the interlayer insulating layer 107, and the data lines DL may be connected to the switching semiconductor layer Act2 of the switching thin film transistor T2 via a contact hole penetrating the interlayer insulating layer 107. The data lines DL may be connected to the switching drain area D2, and a portion of the data lines DL may be a switching drain electrode.

The driving voltage line PL may be disposed on the interlayer insulating layer 107. The driving voltage line PL may include a lower driving voltage line PL-1 and an upper driving voltage line PL-2. Thus, a voltage drop may be prevented in the driving voltage line PL, and thus the display device described herein may display a relatively high-quality image. According to an exemplary embodiment of the present invention, since the lower driving voltage line PL-1 and the upper driving voltage line PL-2 are electrically connected to each other with the interlayer insulating layer 107 therebetween, an increase in the resistance of the driving voltage line PL may be prevented, and the voltage drop that may be caused by the resistance of the driving voltage line PL may be prevented.

The lower driving voltage line PL-1 may include a same material as the data lines DL. For example, the lower driving voltage line PL-1 may include Mo, Al, Cu, or Ti, and may include a single layer or multiple layers. In an exemplary embodiment of the present invention, the lower driving voltage line PL-1 may have a multi-layer structure including Ti/Al/Ti.

The lower driving voltage line PL-1 and the upper driving voltage line PL-2 may be connected to each other via a contact hole defined by a first insulating layer 109 between the lower driving voltage line PL-1 and the upper driving voltage line PL-2. The driving voltage line PL may be substantially covered by a second insulating layer 111, which may be a planarization insulating layer. Thus, the second insulating layer 111 may be a planarization layer and may be interchangeably referred to as a planarization layer. The first insulating layer may also be a planarization layer and may be interchangeably referred to as a planarization layer. The upper driving voltage line PL-2 may include Mo, Al, Cu, or Ti, and may include a single layer or multiple layers. In an exemplary embodiment of the present invention, the upper driving voltage line PL-2 may have a multi-layer structure including Ti/Al/Ti.

The lower driving voltage line PL-1 and the data lines DL may be substantially covered by an inorganic insulating layer 108. The inorganic insulating layer 108 may protect the lower driving voltage line PL-1 and the data lines DL and/or various voltage lines and wires provided in the peripheral area. PA (e.g., described above with reference to FIG. 1), thus preventing damage to the voltage lines and the wires in a manufacturing process of a display device, for example, an etching process.

The first insulating layer 109 may include an organic material. The first insulating layer 109 may include an organic insulating material, such as a general-purpose polymer, such as an imide-based polymer, polymethylmethacrylate (PMMA), polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. The second insulating layer 111 may substantially cover the data lines DL and the driving voltage line PL. The second insulating layer 111 may be an insulating layer including an organic insulating material and may provide a substantially flat surface on which a pixel electrode 310 may be disposed. The organic material may include a general-purpose polymer, such as an imide-based polymer, PMMA, or PS, polymer derivatives having a phenol-based group, an acryl-based polymer, an aryl ether-based polymer, an amide-based polymer, a fluoro-based polymer, a p-xylene-based polymer, a vinyl alcohol-based polymer, or a blend thereof.

The organic light-emitting diode OLED may be located on the second insulating layer 111. The organic light-emitting diode OLED may include the pixel electrode 310, an opposite electrode 330, and an intermediate layer 320 between the pixel electrode 310 and the opposite electrode 330. The intermediate layer 320 may include an emission layer.

The pixel electrode 310 may be disposed on the second insulating layer 111. As an example, the pixel electrode 310 may be electrically connected to the pixel circuits below the second insulating layer 111, for example, the driving and switching thin film transistors T1 and T2, via a contact hole formed in the second insulating layer 111. The pixel electrode 310 may be exposed via an opening of a pixel-defining layer 113. The pixel-defining layer 113 may define the pixel by having an opening exposing the pixel electrode 310. The pixel-defining layer 113 may substantially cover an edge (e.g., upper and side surfaces of an exposed edge or opposite exposed edges) of the pixel electrode 310 and may increase a distance between the pixel electrode 310 and the opposite electrode 330, thus preventing an occurrence of an arc between the pixel electrode 310 (e.g., the edge of the pixel electrode 310) and the opposite electrode 330. The pixel-defining layer 113 may include an organic material, such as PI or hexamethyldisiloxane (HMDSO).

The intermediate layer 320 may include a relatively low molecular weight material or a relatively high molecular weight material. In an exemplary embodiment of the present invention, where the intermediate layer 320 includes a relatively low-molecular weight material, the intermediate layer 320 may have a single-layer or multi-layer structure including a hole injection layer ("HIL"), a hole transport layer ("HTL"), an emission layer ("EML") an electron transport layer ("ETL"), or an electron injection layer ("EIL"), and may include at least one of various organic materials including copper phthalocyanine ("CuPc"), N,N'-Di(naphthalene-1-yl)-N,N'-diphenyl-benzidine ("NPB"), or tris-8-hydroxyquinoline aluminum ("$Alq_3$").

In an exemplary embodiment of the present invention, where the intermediate layer 320 includes a relatively high molecular weight material, the intermediate layer 320 may have a structure including an HTL and an EML. In an exemplary embodiment of the present invention, the HTL may include PEDOT, and the EML may include a relatively high-molecular material such as a poly-phenylenevinylene ("PPV")-based polymer or a polyfluorene-based polymer. However, the structure of the intermediate layer 320 is not limited thereto and may vary. In an exemplary embodiment of the present invention, for example, at least one of layers of the intermediate layer 320 may be integrally formed as a single unitary unit and may be disposed over multiple pixel electrodes 310. Alternatively, the intermediate layer 320 may include a layer patterned to correspond to positions of each of the pixel electrodes 310.

The opposite electrode 330 may be disposed on the intermediate layer 320 and may substantially cover the display area DA (see, e.g., FIG. 1). The opposite electrode 330 may be integrally formed as a single unitary unit.

A thin film encapsulation layer 400 may substantially cover the display 40 (see, e.g., FIG. 1) including the organic light-emitting diodes OLEDs. The thin film encapsulation layer 400 may prevent display elements, such as the organic light-emitting diodes OLEDs, from being damaged due to external moisture or oxygen. The thin film encapsulation layer 400 may include at least one organic encapsulation layer and at least one inorganic encapsulation layer. For example, the thin film encapsulation layer 400 may include a first inorganic encapsulation layer 410, an organic encapsulation layer 420, and a second inorganic encapsulation layer 430.

The first inorganic encapsulation layer 410 may substantially cover the opposite electrode 330, and may include SiOx, SiNx, and/or SiON. Other layers, such as a capping layer, may be between the first inorganic encapsulation layer 410 and the opposite electrode 330. As an example, when the capping layer is not formed, the first inorganic encapsulation layer 410 may include at least two SiON layers having different properties.

The organic encapsulation layer 420 may include at least one material selected from an acryl-based resin, a methacrylbased resin, polyisoprene, a vinyl-based resin, an epoxy-based resin, a urethane-based resin, a cellulose-based resin, or a perylene-based resin.

The second inorganic encapsulation layer 430 may substantially cover the organic encapsulation layer 420 and may include SiOx, SiNx, and/or SiON.

The first and second inorganic encapsulation layers 410 and 430 may be formed by using a chemical vapor deposition (CVD) method, and the organic encapsulation layer 420 may be formed by coating an organic material in a liquid form on the substrate 100 and curing the liquid organic material. A dam 210, which will be described in more detail below with reference to FIG. 4 may be provided in the peripheral area PA, and thus the organic material spread in the liquid form does not flow toward the edge of the substrate 100 and into the pad portion 30 (see, e.g., FIG. 1). Thus, damage to the pad portion 30 may be prevented, and reliability and product yield of the display device described herein may be increased.

Figure 4:
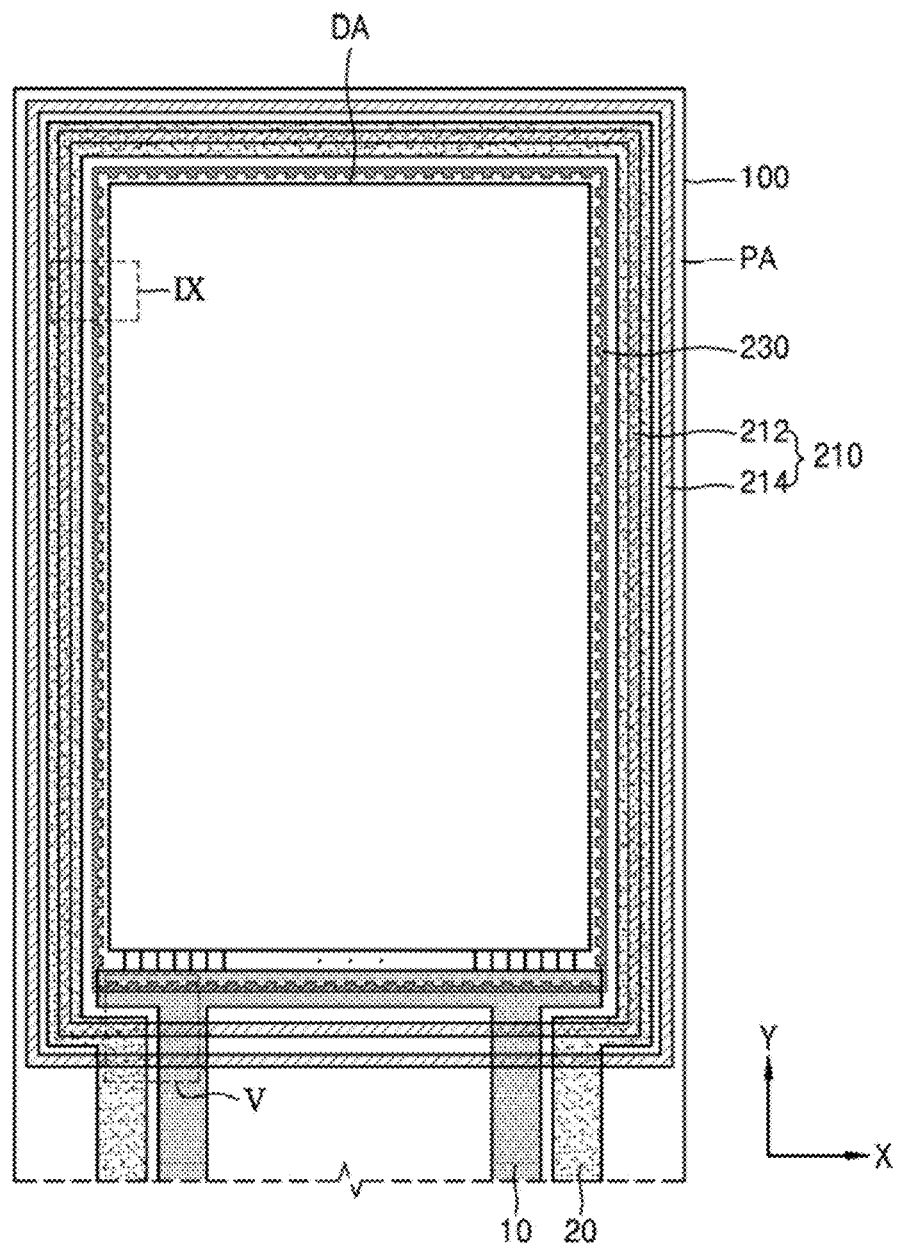
FIG. 4 is a plan view of portions of a display device around power supply lines according to an exemplary embodiment of the present invention.

FIG. 4 is a plan view of portions of a display device around power supply lines according to an exemplary embodiment of the present invention.

Referring to FIG. 4, the dam 210 may have a ring shape surrounding the display area DA (e.g., in a plan view) and may be disposed in the peripheral area PA. The dam 210 may include a first dam 212 and a second dam 214 surrounding the first dam 212 (e.g., in a plan view). The dam 210 may prevent the liquid organic material for forming the organic encapsulation layer 420 of the thin film encapsulation layer 400 from flowing toward the edge of the substrate 100.

As an area of the peripheral area PA decreases, a distance between the first dam 212 and the second dam 214 may decrease. Thus, to increase control of the flow of the liquid organic material for forming the organic encapsulation layer 420, a barrier layer 230 may be disposed between the display area DA and the dam 210. The barrier layer 230 may form a step difference with respect to a layer below the barrier layer 230. The barrier layer may include a predetermined pattern, and may suppress or delay the flow of the liquid organic material. The barrier layer 230 may include a zigzag pattern or a concavo-convex pattern (e.g., when viewed in a plan view along the Z direction).

Figure 5:
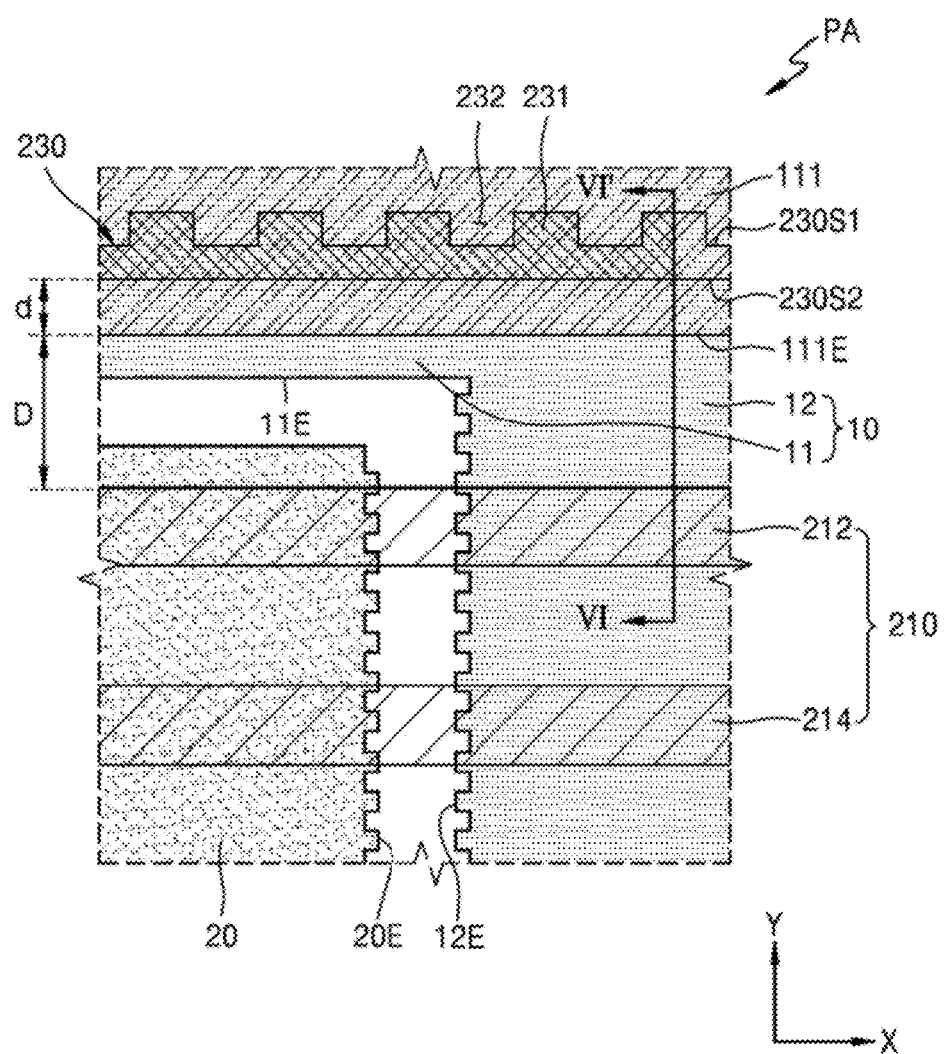
FIG. 5 is a plan view of a portion V of FIG. 4.
Figure 6:
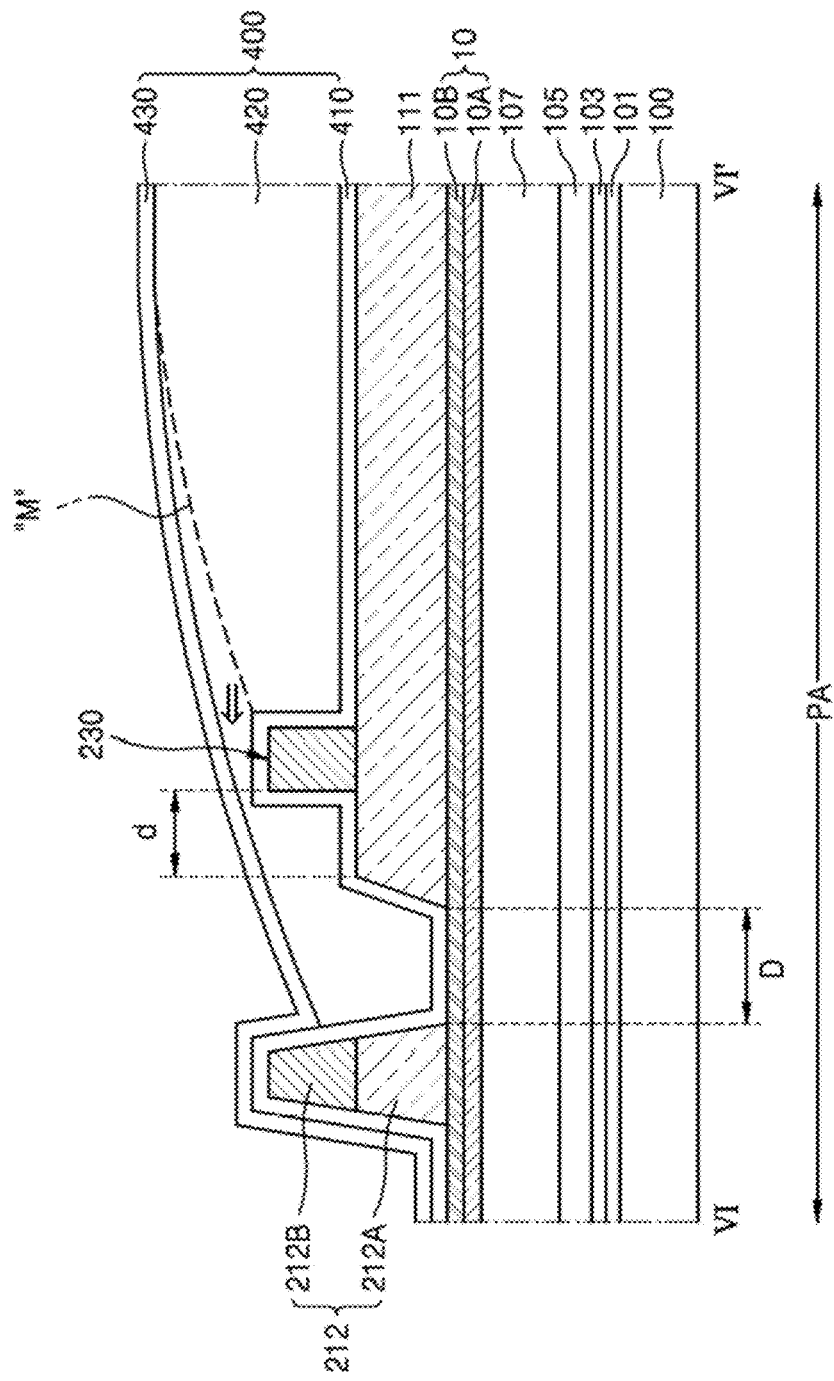
FIG. 6 is a cross-sectional view of the portion V of FIG. 4, taken along a line VI-VI' of FIG. 5.
Figure 7:
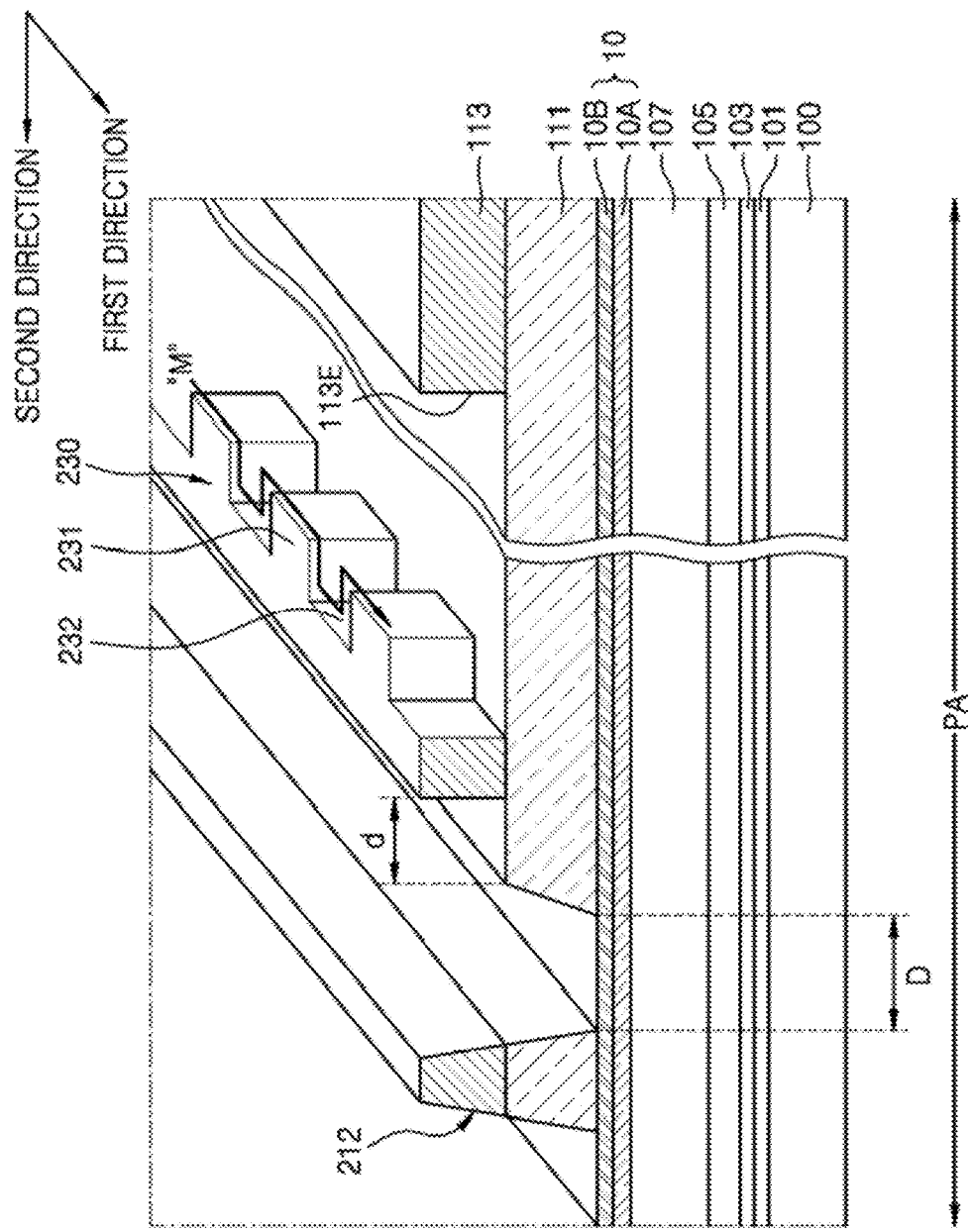
FIG. 7 is a perspective cross-sectional view of a first dam, a barrier layer and portions around the first dam and the barrier layer of a display device according is an exemplary embodiment of the present invention.

FIG. 5 is a plan view of a portion V of FIG. 4. FIG. 6 is a cross-sectional view of the portion V of FIG. 4, taken along a line VI-VI' of FIG. 5. FIG. 7 is a perspective cross-sectional view of a first dam, a barrier layer, and portions around the first dam and the barrier layer of a display device according to an exemplary embodiment of the present invention. In FIG. 7, components provided above the first dam 212 and the barrier layer 230 are not illustrated.

Referring to FIG. 5, the first power supply line 10 including the first body portion 11 extending in a first direction (e.g., in the X direction) and the first connection portion 12 extending in a second direction (e.g., in the Y direction) crossing the first body portion 11 may be located in the peripheral area PA. The second power supply line 20 may be located adjacent to the first power supply line 10.

The first power supply line 10 may include multiple layers. According to an exemplary embodiment of the present invention, the first power supply line 10 may include a first layer 10A and a second layer 108, which are stacked (see, e.g., FIG. 6). The first layer 10A may be formed together with the data lines DL and/or the lower driving voltage line PL-1 (see, e.g., FIG. 3) by the same process so as to include a same material as the data lines DL and/or the lower driving voltage line PL-1, and the second layer 106 may be formed together with the upper driving voltage line PL-2 (see, e.g., FIG. 3) by the same process so as to include a same material as the upper driving voltage line PL-2.

Referring to FIG. 6, portions of the first power supply line 10, such as the portions corresponding to the first body portion 11 and the first connection portion 12, respectively, may each include the first layer 10A and the second layer 106. However, exemplary embodiments of the present invention are not limited thereto. According to an exemplary embodiment of the present invention, a portion of the first power supply line 10, which corresponds to the first body portion 11, may have a structure in which the first layer 10A and the second layer 106 are stacked as described above, while the other portion of the first power supply line 10, which corresponds to the first connection portion 12, may be a single first layer 10A. Similar to the first power supply line 10, the second power supply line 20 may include a plurality of layers. At least a portion of the second power supply line 20 includes a plurality of layers which overlap each other.

The first power supply line 10 may be partially covered by an insulating layer. For example, the second insulating layer 111 may extend onto the first power supply line 10 and may partially cover the first power supply line 10. The second insulating layer 111 may extend to the peripheral area PA beyond the display area DA (see, e.g., FIG. 1) and may partially cover the first power supply line 10. An end 111E of the second insulating layer 111 may be positioned between the dam 210 and the display area DA. The end 111E of the second insulating layer 111 may be spaced apart from the dam 210 by a predetermined distance. As an example, the end 111E of the second insulating layer 111 may be located on the first body portion 11 of the first power supply line 10.

The dam 210 may be disposed on a side of the end 111E of the second insulating layer 111 facing away from the substrate. The first dam 212 may surround the display area DA (e.g., in a plan view) while being spaced apart from the end 111E of the second insulating layer 111 by a first distance D. The first distance D may define a trench formed in the second insulating layer 111 between the barrier layer 230 and the first dam 212. Thus, the trench may have a predetermined width between the barrier layer 230 and the first dam 212 (e.g., along a distance parallel to an upper surface of the substrate 100, such as along the first direction X and/or along the second direction Y). The second dam 214 may surround the display area DA (e.g., in a plan view) while being spaced apart from the end 111E of the second insulating layer 111 by a distance greater than the first distance D.

Referring to FIGS. 6 and 7, a liquid organic material M coated on the substrate 100 to form the organic encapsulation layer 420 of the thin film encapsulation layer 400 may flow in a first direction (e.g., the X direction) and a second direction (e.g., the Y direction). The first direction (e.g., the X direction) may be a direction which is parallel to an edge (e.g., sides) of the display area DA (see, e.g., FIGS. 1 and 4) and the second direction (e.g., the Y direction) may be a direction crossing the first direction (e.g., perpendicular to the first direction). Flow of the liquid organic material M in the first direction and the second direction may be reduced by the barrier layer 230 including a zigzag surface or concavo-convex surface formed on the second insulating layer 111. Additionally, side edges of the first and second power supply lines 10 and 20 may include a concavo-convex shape.

The barrier layer 230 may be disposed on the second insulating layer 111 to form a step difference with respect to an upper surface of the second insulating layer 111. The barrier layer 230 may include a first side surface 230S1 facing the display area DA and a second side surface 230S2 facing away from the display area DA (e.g., at a side opposite to the first side surface 230S1). At least one of the first side surface 230S1 or the second side surface 230S2 may include a zigzag or concave-convex surface. As an example, the first side surface 230S1 of the barrier layer 230 may include the concavo-convex surface, and thus, the barrier layer 230 may have a structure in which a convex portion 231 and a concave portion 232 are alternately provided.

The liquid organic material M for forming the organic encapsulation layer 420 may flow while contacting surfaces forming a step difference between the second insulating layer 111 and the barrier layer 230. For example, the liquid organic material M may flow while contacting the upper surface of the second insulating layer 111 and the first side surface 230S1 of the barrier layer 230. For example, the liquid organic material M may flow in the first direction along the concavo-convex surface of the first side surface 230S1 of the barrier layer 230 and the flow thereof may be suppressed or delayed by the zigzag surface.

The barrier layer 230 may be disposed to overlap (e.g., along the Z direction) the first body portion 11 of the first power supply line 10 (see, e.g., FIG. 5). For example, the barrier layer 230 may overlap the first body portion 11 and may be located between an end 11E of the first body portion 11 and the display area DA. The liquid organic material M may flow (e.g., in the X or Y directions) along the structure having the step difference. The step difference may be formed between the second insulating layer 111 and the barrier layer 230. The step difference may also be formed between an end edge 12E of the first connection portion 12 and a layer (for example, the interlayer insulating layer 107 of FIG. 6) below the end edge 12E of the first connection portion 12 formed.

A margin (for example, a distance between the first side E1 of the display area DA and the edge of the substrate 100) of the peripheral area PA in the second direction may be less than a margin (for example, a distance surrounding the display area DA in a plan view) of the peripheral area PA in the first direction (e.g., a distance between the third and fourth sides E3 and E4 and corresponding outer edges of the substrate 100, respectively). Thus, the barrier layer 230 including the concavo-convex surface along the first direction (e.g., the X direction) may be disposed to overlap (e.g., along the Z direction) the first body portion 11 extending in the first direction. Accordingly, the flow of the liquid organic material M may be reduced. For example, the flow of the liquid organic material M may be delayed by the barrier layer 230 before the liquid organic material M flows in the second direction via the first connection portion 12 extending in the second direction.

The barrier layer 230 may be disposed between the end 111E of the second insulating layer 111 and the display area DA. As an example, the second insulating layer 111 may extend toward the edge of the substrate 100 further than the barrier layer 230 by a second distance "d." Thus, a step difference may further be formed between the second side surface 230S2 of the barrier layer 230 and the upper surface of the second insulating layer 111, and thus the flow of the liquid organic material M may further be reduced or delayed. The flow of the liquid organic material M may further be reduced or delayed when the second side surface 230S2 of the barrier layer 230 includes a zigzag or concavo-convex surface.

The barrier layer 230 may include a same material as the pixel-defining layer 113. For example, the barrier layer 230 may be formed together with the pixel-defining layer 113 by a same process. Referring to FIG. 7, the pixel-defining layer 113 may extend to the peripheral area PA beyond the display area DA. An outer end edge 113E of the pixel-defining layer 113 may be located between the first side surface 230S1 of the barrier layer 230 and the display area DA. Thus, the barrier layer 230 and the pixel-defining layer 113 may be spaced apart from each other.

The liquid organic material M, the flow of which is reduced or delayed by the barrier layer 230, may relatively slowly flow toward the first dam 212 by passing through or over the barrier layer 230 and may form the organic encapsulation layer 420. To delay the flow of the liquid organic material M proceeding in the second direction (e.g., the Y direction), a portion of an edge of the first power supply line 10, for example, the end edge 12E of the first connection portion 12, may include a concavo-convex structure (see, e.g., FIG. 5). Similarly, an end edge 20E of the second power supply line 20 may include a concavo-convex surface.

The organic encapsulation layer 420 formed by the liquid organic material M, the flow of which is delayed by the concavo-convex structures of the barrier layer 230 and the end edges 12E and 20E of the first and second power supply lines 10 and 20, may be located at an inner portion of the dam 210 facing the display area DA while covering the barrier layer 230. An edge of the organic encapsulation layer 420 may be in a position corresponding to an inner side surface of the first dam 212 facing the display area DA.

The first dam 212 may include a plurality of layers including a first dam layer 212A and a second dam layer 212B (see, e.g., FIG. 6). According to an exemplary embodiment of the present invention, the first dam layer 212A may include a same material as the second insulating layer 111 and the second dam layer 212B may include a same material as the barrier layer 230.

The barrier layer 230 may include a same material as the pixel-defining Dyer 113 and may be formed by a same process as the pixel-defining layer 113. The barrier layer 230 may be spaced apart from the pixel-defining layer 113. The pixel-defining layer 113 may extend beyond the display area DA to cover a portion of the first power supply line 10 in the peripheral area PA. However, exemplary embodiments of the present invention are not limited thereto. According to an exemplary embodiment of the present invention, the outer end edge 113E of the pixel-defining layer 113 need not cover the first power supply line 10 while being spaced apart from the barrier layer 230. As such, specific locations of the pixel-defining layer 113 may vary.

According to an exemplary embodiment of the present invention, a display device may include the substrate 100, and the display area DA and the peripheral area PA adjacent to the display area DA may be defined above the substrate 100. A power supply line (e.g., power supply line 10) may be positioned above the substrate 100. An insulating layer (e.g., insulating layer 111) may be disposed on the power supply line. The first inorganic encapsulation layer 410 may be disposed on the insulating layer. The organic encapsulation layer 420 may be disposed on the first inorganic encapsulation layer 410. The second inorganic encapsulation layer 430 may be disposed on the organic encapsulation layer 420. The barrier layer 230 may be disposed on the insulating layer in the peripheral area PA. A dam (e.g., first dam 212) may be disposed on the insulating layer in the peripheral area PA on a side of the barrier layer 230 facing away from the display area DA. An uppermost level of the dam facing away from the substrate 100 may be further away from the substrate 100 than an uppermost level of the barrier layer 230 facing away from the substrate 100.

A trench may be formed in the insulating layer (e.g., insulating layer 111) having a predetermined width between the barrier layer and the dam (e.g., having a width of first distance D).

The barrier layer 230 may include a material different from a material included in the insulating layer 111.

The dam 212 may include a material different from a material included in the insulating layer 111.

Figure 8A:
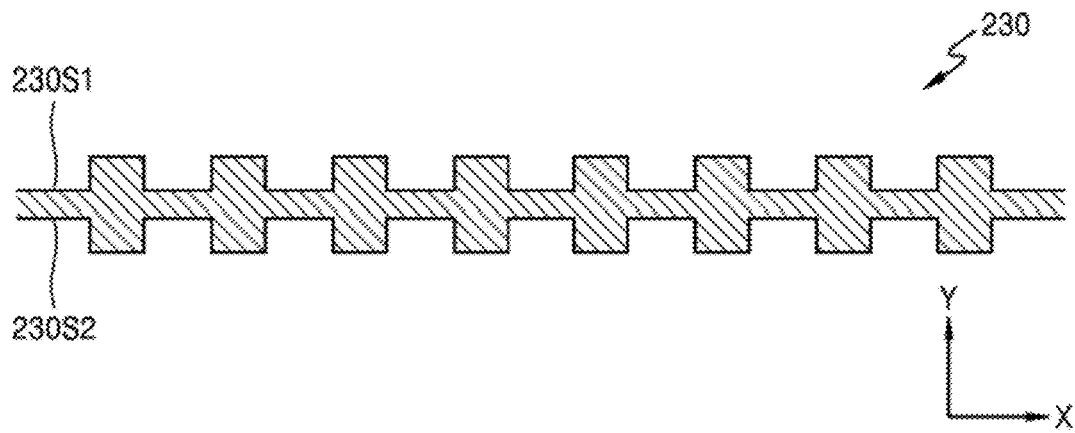
FIGS. 8A, 8B 8C are each plan views of a barrier layer according to an exemplary embodiment of the present invention.
Figure 8B:
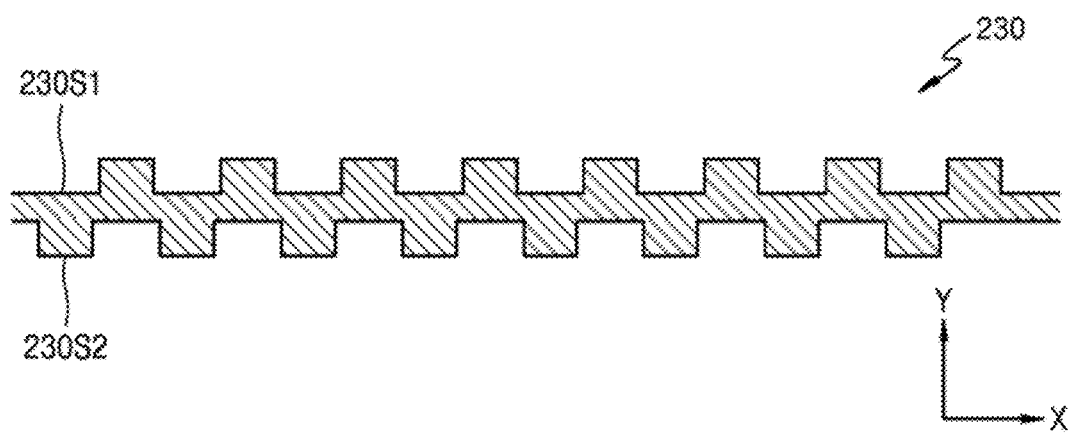
Figure 8C:
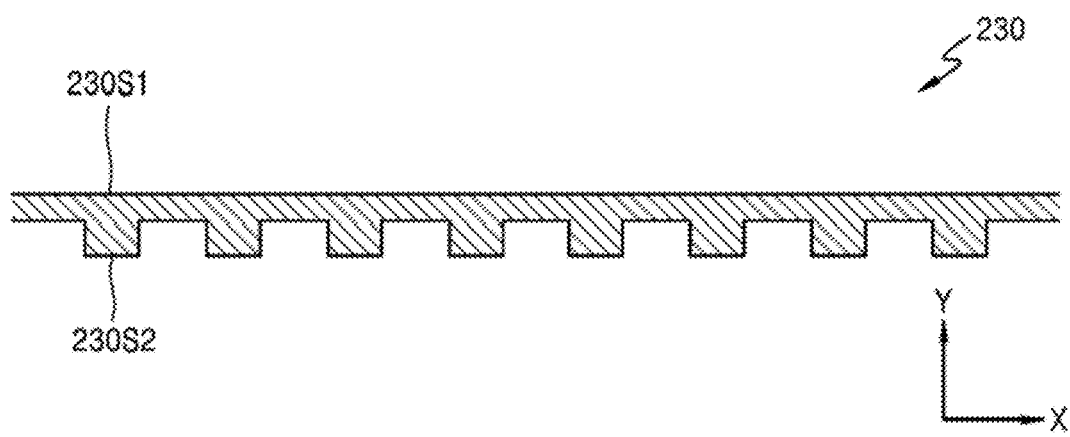

FIGS. 8A, 8B and 8C are each plan views of a barrier layer according to an exemplary embodiment of the present invention.

Referring to FIGS. 8A and 8B, both the first side surface 230S1 and the second side surface 230S2 of the barrier layer 230 may include a zigzag or concavo-convex surface, and specific shapes thereof may be variously modified. For example, a convex region of the first side surface 230S1 and a convex region of the second side surface 230S2 may be adjacent to each other or aligned with each other along the second direction Y (see, e.g., FIG. 8A). Alternatively, the convex region of the first side surface 230S1 and a concave region of the second side surface 230S2 may be adjacent to each other or aligned with each other along the second direction Y (see, e.g., FIG. 8B). Alternatively, only the second side surface 230S2 of the first side surface 230S1 and the second side surface 230S2 of the barrier layer 230 may include a zigzag or concavo-convex surface (see, e.g., FIG. 8C).

According to an exemplary embodiment of the present invention, the zigzag or concavo-convex surfaces of the barrier layer 230 may include square shapes when viewed in a plan view (e.g., on a plane defined by the first direction X and the second direction Y). However, exemplary embodiments of the present invention are not limited thereto. Shapes of the zigzag or concavo-convex surface of the barrier layer 230 may be variously modified. For example, the zigzag or concavo-convex surface may have a polygonal shape, such as a triangular shape, or a round shape, such as a semi-circular shape (e.g., when viewed in a plan view).

Figure 9:
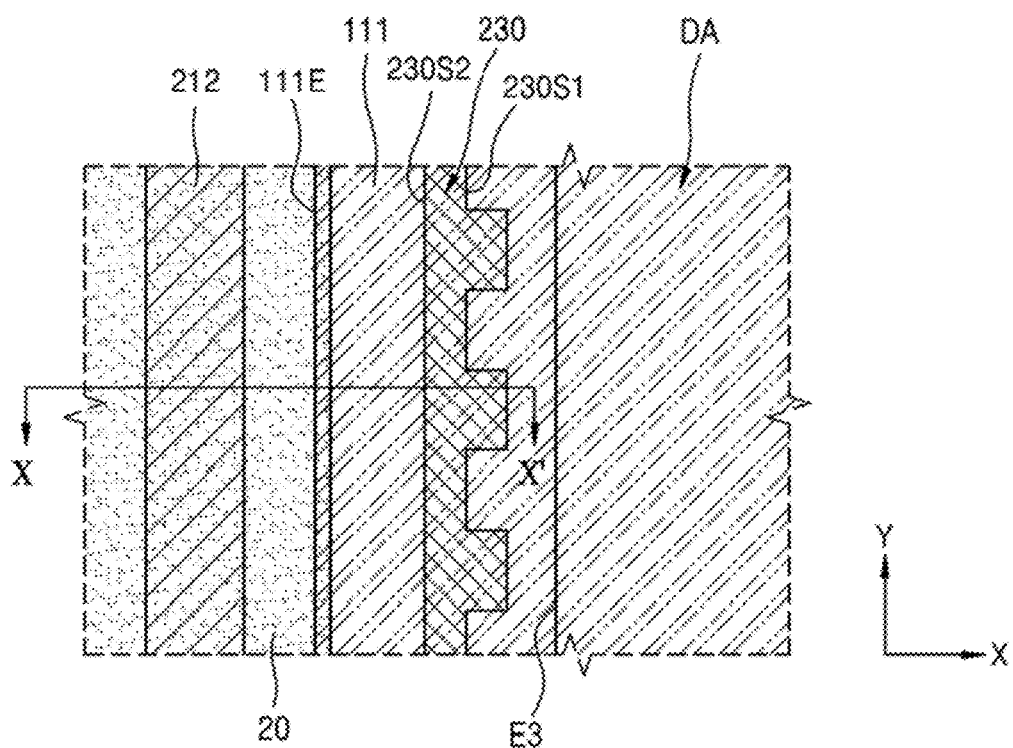
FIG. 9 is a plan view of a portion IX of FIG. 4.
Figure 10:
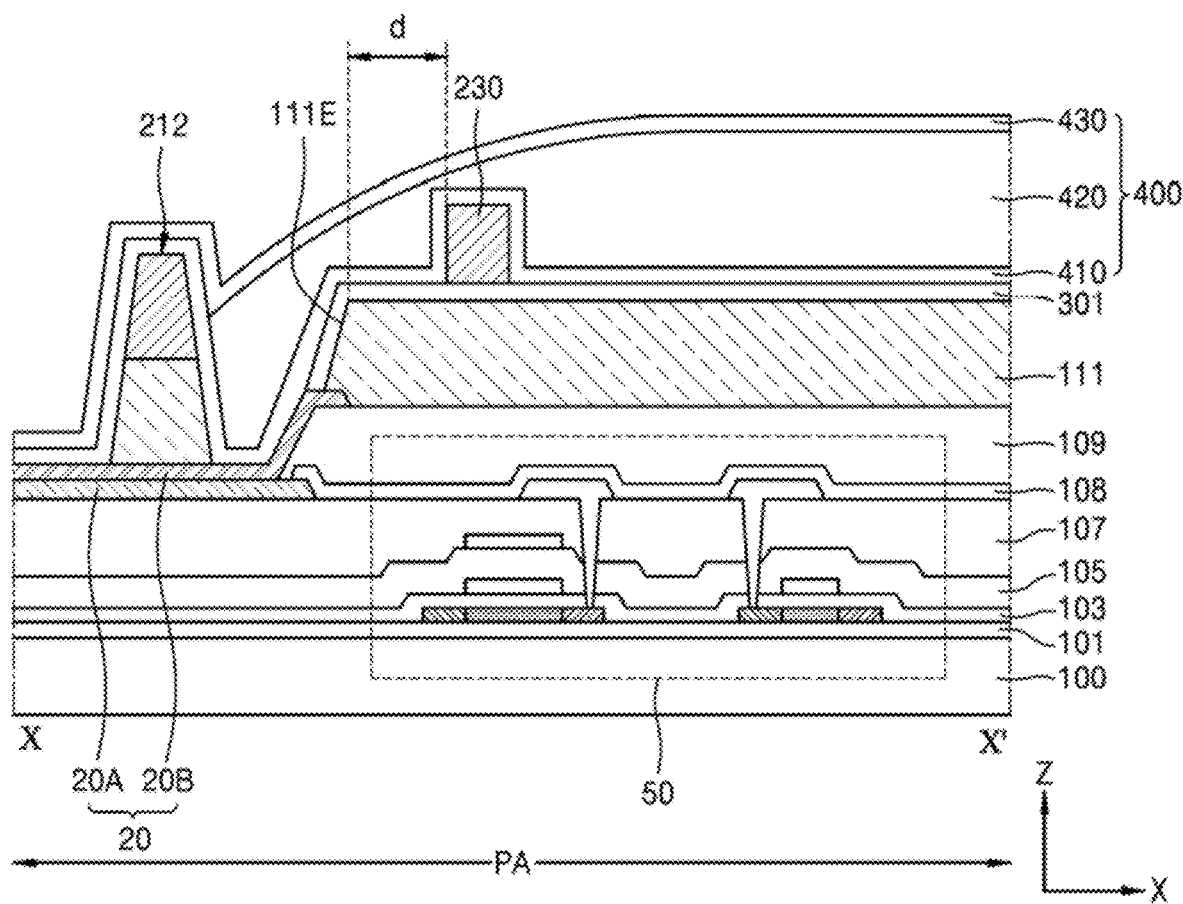
FIG. 10 is a cross-sectional view of the portion IX of FIG. 4; taken along a line X-X' of FIG. 9.

FIG. 9 is a plan view of a portion IX of FIG. 4. FIG. 10 is a cross-sectional view of the portion IX of FIG. 4, taken along a line X-X' of FIG. 9.

Referring to FIGS. 9 and 10, the barrier layer 230 may be disposed to surround the display area DA (e.g., such as in a plan view—see, e.g., FIG. 4) and may control the flow of the liquid organic material M. As an example, the barrier layer 230 may be disposed adjacent to the third side E3 of the display area DA. The barrier layer 230 may be disposed on the second insulating layer 111 while forming a step difference with respect to the second insulating layer 111. As an example, the second insulating layer 111 may extend toward the edge (e.g., the outer edge) of the substrate 100 beyond the barrier layer 230 by the second distance "d" and may include the zigzag or concavo-convex surface, as described above with reference to FIGS. 5 through 7, and thus duplicative descriptions may be omitted below.

A portion of the barrier layer 230 adjacent to the third side E3 of the display area DA, may overlap a driving circuit portion 50 provided therebelow (e.g., along the Z direction). The driving circuit portion 50 may be a scan driver, which may be connected with the scan lines SL and may provide a scan signal to the scan lines SL.

The dam 210 may be disposed to surround the display area. DA (e.g., in a plan view—see, e.g., FIG. 4). The dam 210 may control the flow of the liquid organic material M.

For example, the first dam 212 may be disposed to overlap the second power supply line 20 adjacent to the third side E3 of the display area. DA (e.g., along the Z direction).

The second power supply line 20 may be disposed adjacent to the third side E3 of the display area DA, and the second power supply line 20 may have a structure in which a first layer 20A and a second layer 20B are stacked. The second power supply line 20 may be connected to the opposite electrode 330 (see, e.g., FIG. 3) of the organic light-emitting diode OLED via a connection electrode layer 301 between the second insulating layer 111 and the barrier layer 230.

According to an exemplary embodiment of the present invention, the flow of the liquid organic material for forming the organic encapsulation layer may be delayed via the barrier layer provided at an inner portion of the dam, and thus, an area of the peripheral area of the display element may be reduced.

It should be understood that embodiments described herein should be considered in a descriptive sense and not for purposes of limitation. Descriptions of features or aspects within each embodiment should typically be considered as available for other similar features or aspects in other embodiments.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device having a display area from which light is emitted and a non-display area around the display area, the display device comprising:
    a plurality of display elements in the display area;
    an encapsulation layer on the plurality of display elements;
    a dam in the non-display area; and
    a barrier layer between the dam and the display area, the barrier layer including a first side surface facing the display area and a second side surface opposite to the first side surface, wherein at least one of the first side surface or the second side surface comprises a concavo-convex surface.

2. The display device of claim 1, wherein the dam is spaced apart from the barrier layer by a preset distance.

3. The display device of claim 1, wherein each of the plurality of display elements comprises:
    a pixel electrode;
    an emission layer on the pixel electrode; and
    a opposite electrode on the emission layer.

4. The display device of claim 3, further comprising:
    pixel-defining layer on the pixel electrode, the pixel-defining layer covers an edge of the pixel electrode of the each of the plurality of display elements,
    wherein the barrier material comprises a same material as the pixel-defining layer.

5. The display device of claim 1, wherein the barrier layer comprises an organic material.

6. The display device of claim 1, further comprising:
    an insulating layer under the barrier layer.

7. The display device of claim 6, further comprising:
    a substrate including a main surface; and
    a plurality of transistors on the main surface of the substrate, each of the plurality of transistors electrically coupled to each of the plurality of display elements, wherein the plurality of transistors are between the substrate and the insulating layer in a direction perpendicular to the main surface of the substrate.

8. The display device of claim 6, wherein the dare is paced apart from an edge of the insulating layer.

9. The display device of claim 1, wherein the encapsulation layer comprises:
 a first inorganic encapsulation layer;
 an organic encapsulation layer on the first inorganic encapsulation layer; and
 a second inorganic encapsulation layer on the organic encapsulation layer.

10. The display device of claim 1, wherein the concavo-convex surface comprises a quadrangular shape, a triangular shape, a round shape, or a semi-circular shape.

* * * * *